(12) United States Patent
Chen

(10) Patent No.: US 7,679,070 B2
(45) Date of Patent: Mar. 16, 2010

(54) ARC CHAMBER FOR AN ION IMPLANTATION SYSTEM

(75) Inventor: Jung-Chi Chen, Hsinchu County (TW)

(73) Assignee: United Microelectronics Corp., Hsin-Chu (TW)

( * ) Notice: Subject to any disclaimer, the term of this patent is extended or adjusted under 35 U.S.C. 154(b) by 322 days.

(21) Appl. No.: 11/772,822

(22) Filed: Jul. 2, 2007

(65) Prior Publication Data

US 2009/0008570 A1  Jan. 8, 2009

(51) Int. Cl.
*H01J 37/317* (2006.01)
*H01J 37/08* (2006.01)
*H01J 27/08* (2006.01)

(52) U.S. Cl. .................. 250/492.21; 250/426; 250/425; 250/423 R; 250/492.2; 315/111.21

(58) Field of Classification Search ............ 250/492.21, 250/492.2, 423 R, 425, 426; 315/111.21
See application file for complete search history.

(56) References Cited

U.S. PATENT DOCUMENTS

| 5,554,852 | A | * | 9/1996 | Bright et al. ............ 250/492.21 |
| 2008/0179545 | A1 | * | 7/2008 | Perel et al. ............. 250/492.21 |
| 2008/0237496 | A1 | * | 10/2008 | Gupta .................... 250/492.21 |

* cited by examiner

*Primary Examiner*—Nikita Wells
(74) *Attorney, Agent, or Firm*—Winston Hsu

(57) ABSTRACT

An arc chamber for an ion implantation system includes an exit aperture positioned at a wall of the arc chamber, filaments respectively positioned at two opposing sides within the arc chamber, and repeller structures respectively positioned at two opposing walls within the arc chamber between the filaments and the arc chamber. The repeller structure includes a repeller substrate with a screw axis for fitting the repeller structure to the arc chamber, an insulator positioned underneath the repeller substrate providing an electrical isolation between the repeller substrate and the arc chamber, and a conductive spacer covering a portion of the insulator positioned in between the insulator and the arc chamber.

25 Claims, 4 Drawing Sheets

ARC CHAMBER FOR AN ION IMPLANTATION SYSTEM

BACKGROUND OF THE INVENTION

1. Field of the Invention

This invention relates to an arc chamber for an ion implantation system, and more particularly, to a repeller of the arc chamber for an ion implantation system.

2. Description of the Prior Art

Ion implantation is a key technology in manufacture of integrated circuits (ICs). In the manufacture of logic and memory ICs, ions are implanted into silicon or GaAs wafers to form transistor junctions, and to dope the well regions of the p-n junctions, etc. A number of dopants or ions have previously been used, such as boron (B), phosphorus (P), arsenic (As), germanium (Ge), and the like. Though those species are of solid elemental form, many are obtainable in gaseous molecular form, such as fluoride compounds that are ionizable in large quantities at significantly elevated temperatures.

Various ion implantation systems are well known, using several types of ion sources. The ion implantation system is a manufacture tool which ionizes the dopant-containing feed materials, extracts the dopant ions of interest, accelerates the dopant ions to the desired energy, filters away undesired ionic species, and then transports the dopant ions of interest to the wafer at the appropriate energy for impact upon the wafer. A part of the system of great importance in the technology of ion implantation system is the ion source. Please refer to FIG. 1, which is a schematic drawing of a conventional ion source of a high current ion implantation system. As shown in FIG. 1, an ion source comprises an arc chamber 10, and the arc chamber 10 is fitted with an exit aperture 12, a gas inlet port 14 for feeding a gas such as fluorides of a number of the desired dopant species into the arc chamber 10, a vaporizer 16 in which solid feed materials such As may be vaporized, magnets 18 for applying magnetic fields to increase the electron path length, filaments 20 serving as cathodes with a power supply, and repellers 22 respectively positioned between the filaments and walls of the arc chamber 10 serving as anti-cathodes.

When power is fed to the filaments 20, temperature of the filaments 20 is increased to about 2000° K. up to about 2800° K. so that arc electrons which bombard the precursor gas molecules, break up the gas molecules so that a plasma is formed containing the electrons and various ions are generated. In the same time, the repellers 22 serve to reflect the arc electrons confined by the magnetic fields back toward the filaments 20, thus the plasma density is increased. Then the plasma is emitted from the arc chamber 10 through the exit aperture 12 and selectively passed to a target.

Please refer to FIG. 2, which is a schematic drawing of a conventional repeller structure 22. As shown in FIG. 2, the repeller 22 has a repeller substrate 24 made of metal for reflecting the arc electrons, a screw axis 26 for fitting the repeller structure 22 to the arc chamber 10, an insulator 28 formed underneath the repeller substrate 24, and a cylindrical insulating spacer 30 positioned between the insulator 28 and arc chamber 10. The insulator 28 and the insulating spacers 30 provide electrical isolation between the repeller structure 22 and the arc chamber 10. The insulating spacer 30 ended at the wall of the arc chamber 10 is made of material capable of withstanding high temperatures such as boron nitride.

Please refer to FIGS. 1 and 2 again. While generating the arc electrons, some byproducts or impurities are formed and adhered onto insulating spacers 30, thus a conductive coating is formed on the insulating spacers 30, even on the insulator 28 and from the insulator 28 to the repeller substrate 24. Consequently, the conducive coating may be formed from repeller substrate 24 to the filament 20 nearby and a short circuit is caused. Thus lifetime of the filaments 20 is shortened and the filaments 20 have to be replaced. Secondly, since the arc chamber 10 is positioned vertically, once the conductive coating peels from the repeller substrate 24, it falls on the filament 22, even on the filament 22 on the other side. It is observed that, in such condition, more power is needed to heat the filaments 20 for generating the arc electrons, and more severely, stability of the ion beam is interfered, even rendering the ion beam unusable. At this point, lifetime of the filaments 20 is also shortened and the filaments 20 have to be replaced. Conventionally, lifetime of a filament 20 is less than 7 days due to abovementioned problems. Thus down time for the ion implantation system is caused and cost is increased.

SUMMARY OF THE INVENTION

Therefore the present invention provides an arc chamber for an ion implantation system having repeller structure capable of expanding lifetime of the filament and improving stability of the generated ion beam.

According to the claimed invention, an arc chamber for an ion implantation system is provided. The arc chamber comprises an exit aperture positioned at a wall of the arc chamber, filaments respectively positioned at two opposing sides within the arc chamber, and repeller structures respectively positioned at two opposing walls within the arc chamber between the filaments and the arc chamber. The repeller structure comprises a repeller substrate with a screw axis for fitting the repeller structure to the arc chamber, an insulator positioned underneath the repeller substrate for providing an electrical isolation between the repeller substrate and the arc chamber, and a conductive spacer positioned in between the insulator and the arc chamber, the conductive spacer covering a portion of the insulator.

According to the claimed invention, a repeller structure of an arc chamber comprises a repeller substrate with a screw axis for fitting the repeller structure to the arc chamber, an insulator positioned underneath the repeller substrate for providing an electrical isolation between the repeller substrate and the arc chamber, and a conductive spacer positioned in between the insulator and the arc chamber, the conductive spacer covering a portion of the insulator is provided.

The repeller structure provided by the present invention traps byproducts or impurities formed in ion beam generation, therefore a conductive coating is formed and adhered tightly on the conductive spacer. Thus not only peeling of the conductive coating is reduced, but also the possibility of formation of the conductive coating on the insulator, the repeller substrate, and even on the filaments is reduced. Therefore lifetime of the filament is expanded and stability of the generated ion beam is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
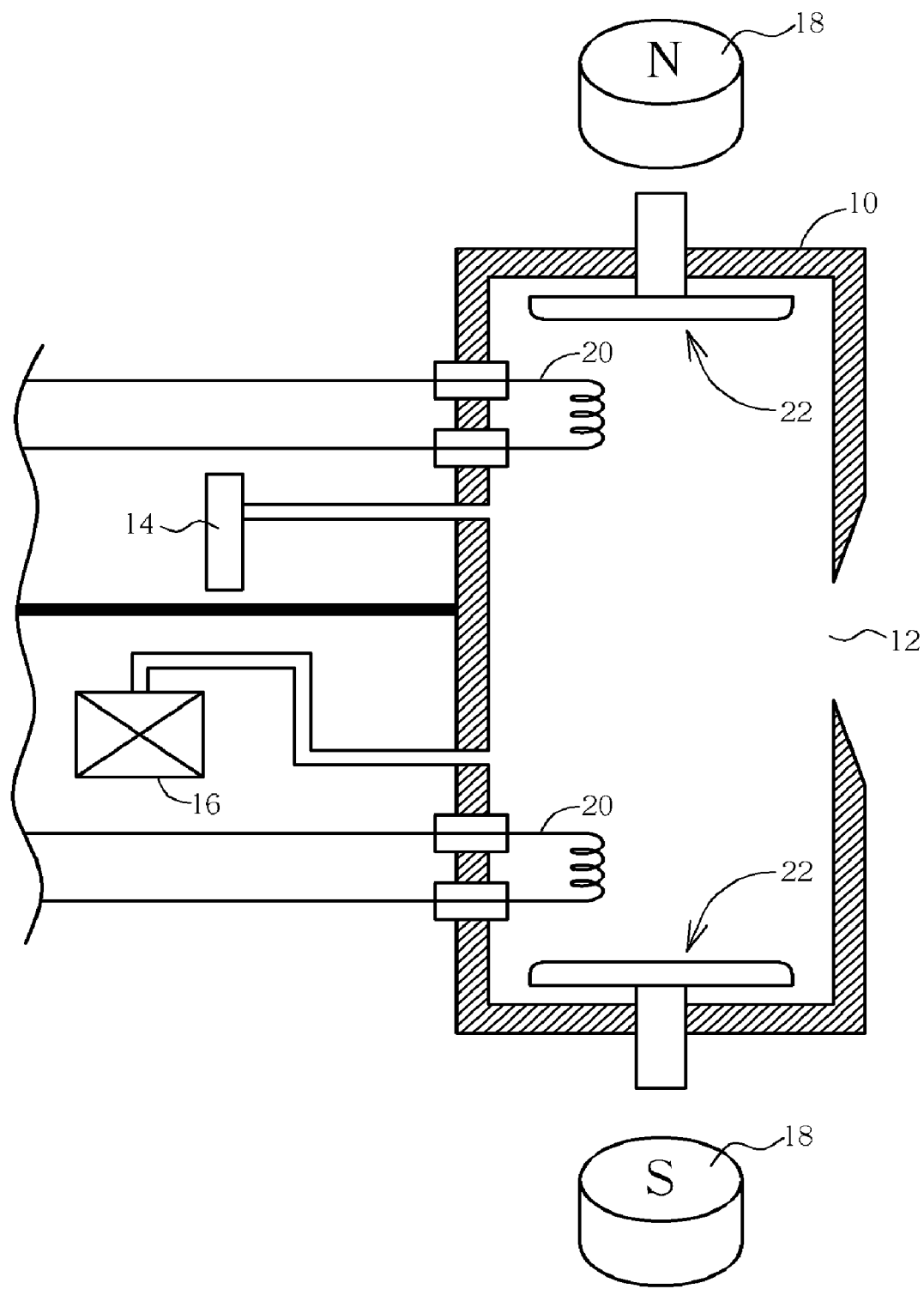
FIG. 1 is a schematic drawing of a conventional ion source of a high current ion implantation system.
Figure 2:
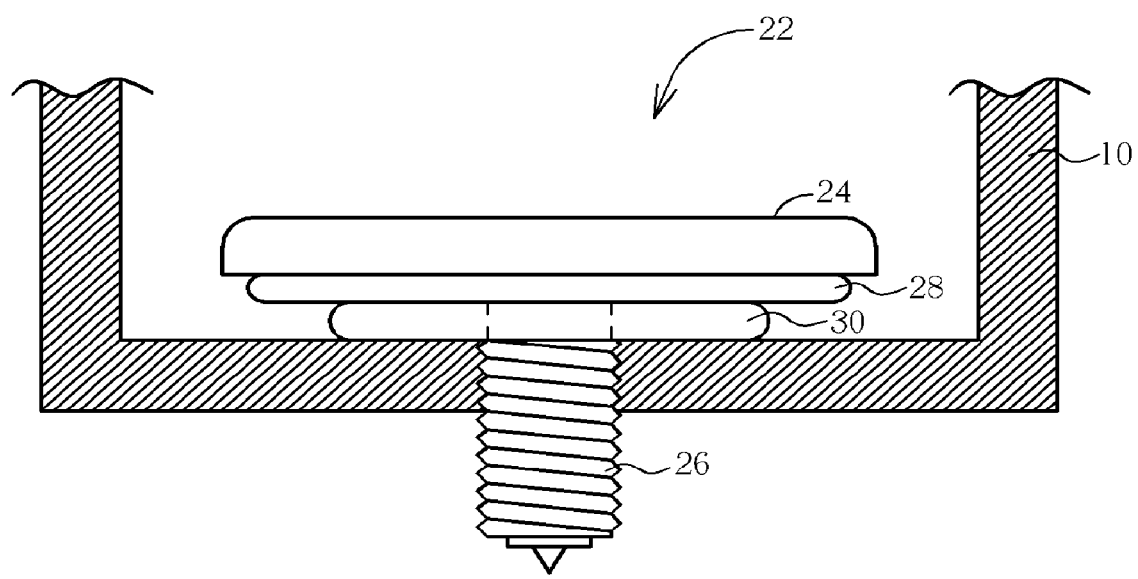
FIG. 2 is a schematic drawing of a conventional repeller structure.
Figure 3:
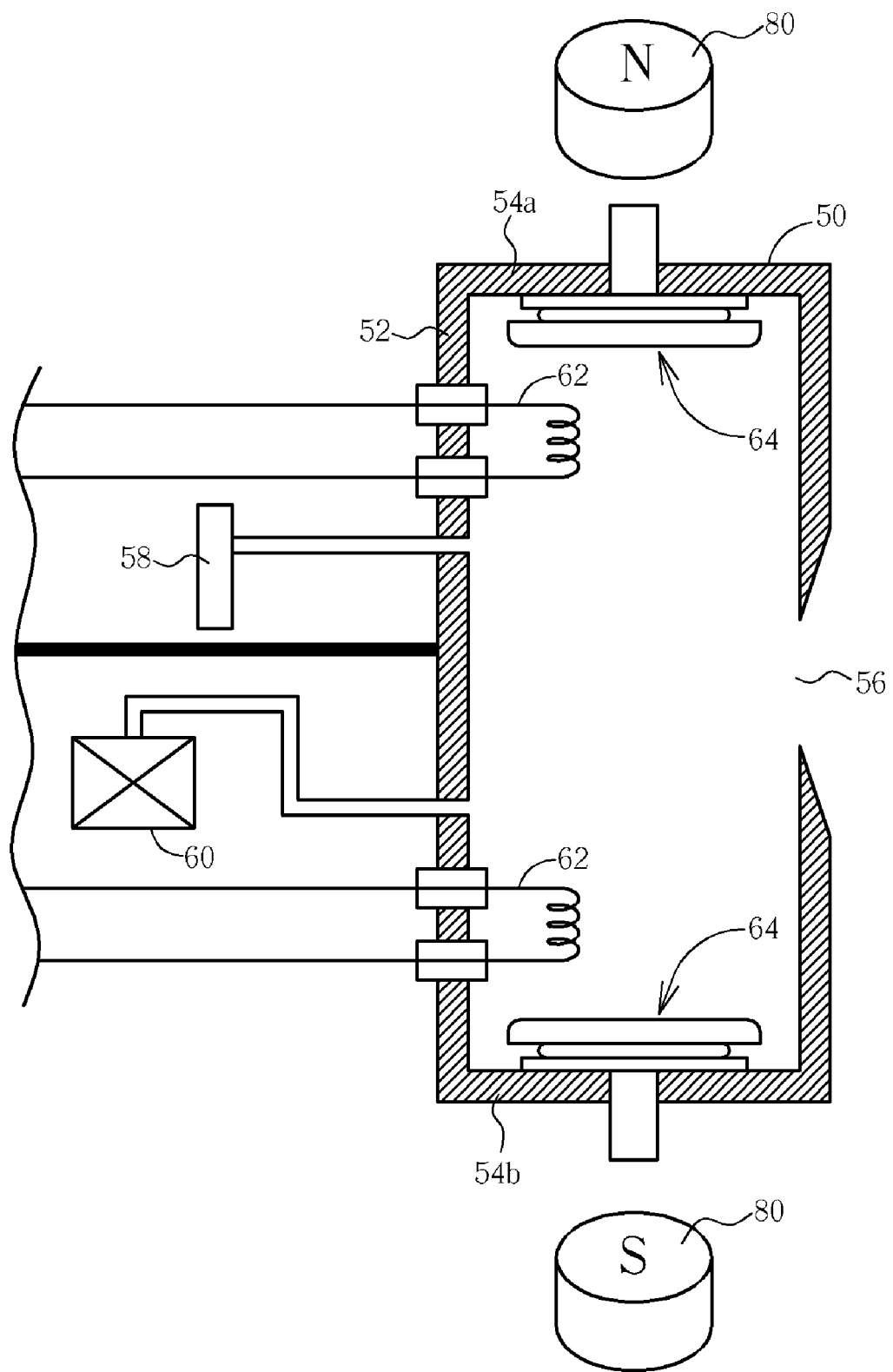
FIG. 3 is a cross-sectional view of an arc chamber provided by a preferred embodiment.

Please refer to FIG. 3, which is a cross-sectional view of an arc chamber provided by a preferred embodiment of the present invention. As shown in FIG. 3, an arc chamber 50 for an ion implantation system is provided. The arc chamber 50 is of a rectangular form with four elongated side walls 52, a top wall 54a, and a bottom wall 54b. And an exit aperture 56 is positioned at a front side wall 52 allowing an ion beam to be extracted from the arc chamber 50. The arc chamber 50 is made of a conductive material and further comprises a gas inlet port 58 for feeding a gas of desired dopant species such as $BF_3$ or $SiF_4$ into the arc chamber 50 and a vaporizer 60 for vaporizing solid feed materials such as antimony, arsenic, or phosphorus. The arc chamber 50 is also equipped with external magnets 80 respectively positioned at the top wall 54a and the bottom wall 54b.

As shown in FIG. 3, the arc chamber 50 essentially comprises coiled filaments respectively positioned on two opposing sides within the arc chamber 50. Particularly, the filaments 62 are respectively positioned near the top wall 54a and the bottom wall 54b. The arc chamber 50 also comprises repeller structures 64 respectively positioned at two opposing walls, namely the top wall 54a and the bottom wall 54b within the arc chamber 50. The repeller structures 64 are respectively positioned between the filaments 62 and the arc chamber 50.

Figure 4:
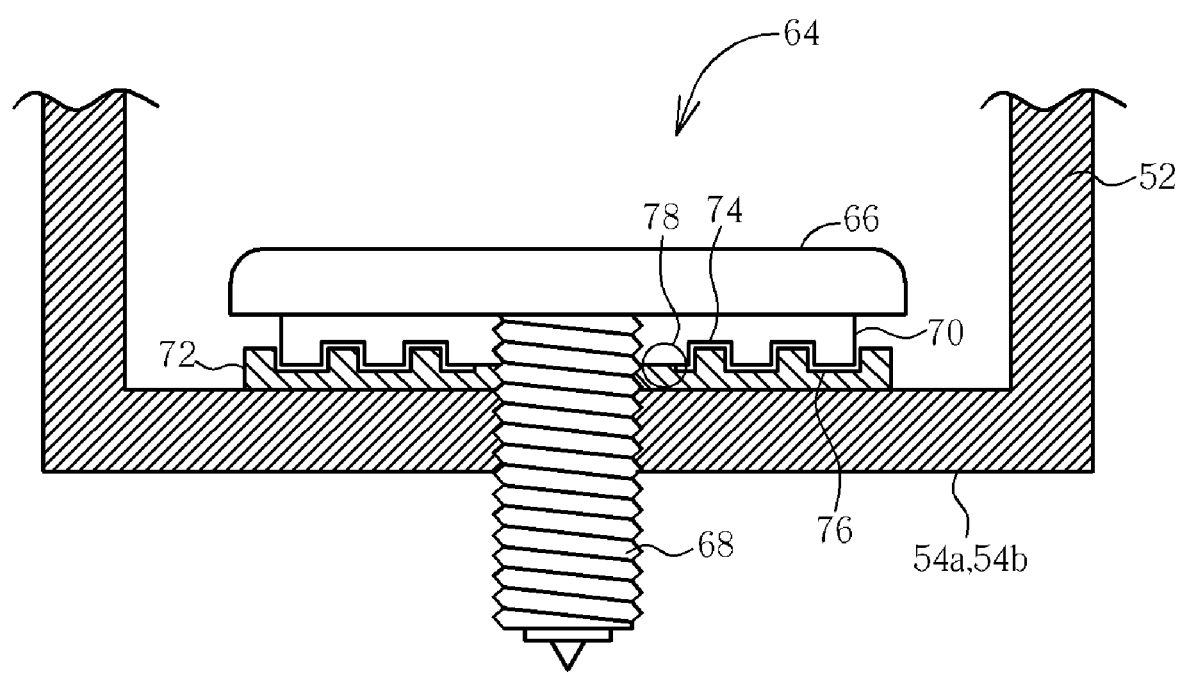
FIG. 4 is a cross-sectional view of the repeller structure.

Please refer to FIG. 4, which is a cross-sectional view of the repeller structure 64 provided by the preferred embodiment of the present invention. As shown in FIG. 4, the repeller structure 64 comprises a repeller substrate 66 made of conductive material such as molybdenum, tungsten, or other suitable metal. The repeller structure 64 comprises a screw axis 68 for fitting the repeller structure 64 to the arc chamber 50. The repeller structure 64 also comprises an insulator 70 positioned underneath the repeller substrate 66 for providing an electrical isolation between the repeller substrate 66, and the arc chamber 50 and a conductive spacer 72 positioned in between the insulator 70 and the arc chamber 50. It is noteworthy that the conductive spacer 72 is not smaller than the insulator 70 and covers a portion of the insulator 70.

Please refer to FIG. 4 again. The insulator 70 is made of material capable of withstanding high temperatures such as boron nitride. And the conductive spacer 72 is made of material capable of withstanding high temperatures such as metal or, preferably, graphite. The conductive spacer 72 has a hole in its center allowing the screw axis 68 through, which means the conductive spacer 72 is removable from the repeller structure 64. Additionally, as shown in FIG. 4, the insulator 70 comprises a plurality of concentric circular slots 74 at a surface toward the conductive spacer 72, and the conductive spacer 72 comprises a plurality of concentric circular slots 76 corresponding to the slots 74 of the insulator 70. More particularly, the slots 74 of the insulator 70 and the slots 76 of the conductive spacer 72 are engaged without contacting. The insulator 70 and the conductive spacer 72 contact each other in the innermost portion, as circle 78 shown FIG. 4.

Please refer to FIGS. 3 and 4. In operation, the filaments 52 are heated by currents provided filament power supplies (not shown) to the point of thermionic emission of electrons. Arc electrons generated by the filaments 52 that are emitted into the arc chamber 50 but do not engage a gas molecule may move to the vicinity of the repeller structure 64 and are reflected toward the filaments 62 by the repeller substrate 66 for joining bombardment to the gas molecules again. Thus the arc electrons generated from the filaments 62 oscillate along a magnet field, which is parallel to the repeller structure 64 and built by the external magnets 80, and a plasma density is increased.

According to the repeller structure 64 provided by the present invention, byproducts or impurities formed in the operation are caught or trapped by the conductive spacers 72, therefore a conductive coating will be formed on the conductive spacer 72 for a start. Please refer to FIG. 4 again. Since the conductive spacers 72 cover a portion of the insulators 70 at its fringes, the insulators 70 are additionally protected from the byproducts or impurities by the conductive spacers 72. Furthermore, the slots 76 of the conductive spacer 72 creates more area for forming the conductive coating, consequently it is observed that the conductive coating is formed on the outer slots 76 of the conductive spacer 72 while the inner slots 76 and the innermost contact portion between the conductive spacer 72 and the insulator 70 is kept from the conductive coating. More important, the conductive coating formed on the conductive spacer 72 is tightly adhered on it, therefore problem such peeling is also prevented. Additionally, an overall thickness of the repeller substrate 66, the insulator 70, and the conductive spacer 72 is similar with the conventional repeller structure, therefore the repeller structure 64 provided by the present invention is allowed to replace conventional repeller structure not only in the ion source of the high current ion implantation system, but also in other types of ion source such as Bernas, Freeman, Nier, and other ion source.

As mentioned above, because the conductive coating is apt to form on the conductive spacer 72, the insulator 70 and the repeller substrate 66, which is nearby the filament 62, are both prevented from forming the conductive coating. Thus function of the repeller substrates 66 of reflecting the arc electron toward the filaments 62 is maintained and stability of the generated ion beam is improved. It is noteworthy that even the filament 62 is prevented from forming the conductive coating consequently. Furthermore, as mentioned above, since the conductive coating formed on the conductive spacer 72 is tightly adhered on it, problems such peeling are also prevented. The filaments 62 need no more power supply to generate the arc electron since no impurities formed or peeled on them, and lifetime of the filaments 62 is accordingly expanded from less than 7 days to 12-14 days.

In summary, the repeller structure provided by the present invention traps byproducts or impurities formed in ion beam generation, therefore a conductive coating is formed and adhered tightly on the conductive spacer for a start. It is observed that not only peeling of the conductive coating is reduced, but also the possibility of formation of the conductive coating on the insulator, the repeller substrate, and even on the filaments is reduced. Therefore lifetime of the filament is expanded and stability of the generated ion beam is improved.

Those skilled in the art will readily observe that numerous modifications and alterations of the device and method may be made while retaining the teachings of the invention.

What is claimed is:

1. An arc chamber for an ion implantation system comprising:

an exit aperture positioned at a wall of the arc chamber;

filaments respectively positioned on two opposing sides within the arc chamber; and repeller structures respectively positioned at two opposing walls within the arc chamber between the filaments and the arc chamber, comprising:

a repeller substrate with a screw axis for fitting the repeller structure to the arc chamber;

an insulator positioned underneath the repeller substrate for providing an electrical isolation between the repeller substrate and the arc chamber; and a conductive spacer positioned in between the insulator and the arc chamber, the conductive spacer covering a portion of the insulator.

2. The arc chamber of claim 1 further comprising a gas inlet port for feeding a gas of desired dopant species into the arc chamber.

3. The arc chamber of claim 1 further comprising a vaporizer for vaporizing solid feed materials.

4. The arc chamber of claim 1 further comprising external magnets providing a magnetic field parallel to the repeller structures.

5. The arc chamber of claim 1, wherein the repeller substrate comprises metal.

6. The arc chamber of claim 1, wherein the insulator comprises material capable of withstanding high temperatures.

7. The arc chamber of claim 6, wherein the insulator comprises boron nitride.

8. The arc chamber of claim 1, wherein the insulator comprises a plurality of concentric circular slots at a surface toward the conductive spacer.

9. The arc chamber of claim 8, wherein the conductive spacer comprises a plurality of concentric circular slots corresponding to the slots of the insulator.

10. The arc chamber of claim 9, wherein the slots of the insulator and the slots of the conductive spacer are engaged without contacting.

11. The arc chamber of claim 1, wherein the conductive spacer has a hole in the center allowing the screw axis through.

12. The arc chamber of claim 1, wherein the conductive spacer comprises material capable of withstanding high temperatures.

13. The arc chamber of claim 12, wherein the conductive spacer comprises metal.

14. The arc chamber of claim 12, wherein the conductive spacer comprises graphite.

15. A repeller structure of an arc chamber comprising:

a repeller substrate with a screw axis for fitting the repeller structure to an arc chamber;

an insulator positioned underneath the repeller substrate for providing an electrical isolation between the repeller substrate and the arc chamber; and a conductive spacer positioned in between the insulator and the arc chamber, the conductive spacer covering a portion of the insulator.

16. The arc chamber of claim 15, wherein the repeller substrate comprises metal.

17. The arc chamber of claim 15, wherein the insulator comprises material capable of withstanding high temperatures.

18. The arc chamber of claim 15, wherein the insulator comprises boron nitride.

19. The arc chamber of claim 15, wherein the insulator comprises a plurality of concentric circular slots at a surface toward the conductive spacer.

20. The arc chamber of claim 19, wherein the conductive spacer comprises a plurality of concentric circular slots corresponding to the slots of the insulator.

21. The arc chamber of claim 20, wherein the slots of the insulator and the slots of the conductive spacer are engaged without contacting.

22. The arc chamber of claim 15, wherein the conductive spacer has a hole in the center allowing the screw axis through.

23. The arc chamber of claim 15, wherein the conductive spacer comprises material capable of withstanding high temperatures.

24. The arc chamber of claim 23, wherein the conductive spacer comprises metal.

25. The arc chamber of claim 23, wherein the conductive spacer comprises graphite.

* * * * *